(12) United States Patent
Shen

(10) Patent No.: US 9,978,782 B2
(45) Date of Patent: May 22, 2018

(54) MANUFACTURING METHOD OF ARRAY SUBSTRATE, ARRAY SUBSTRATE AND DISPLAY APPARATUS

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventor: Qiyu Shen, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 120 days.

(21) Appl. No.: 14/767,759

(22) PCT Filed: Mar. 20, 2015

(86) PCT No.: PCT/CN2015/074684
§ 371 (c)(1),
(2) Date: Aug. 13, 2015

(87) PCT Pub. No.: WO2016/061995
PCT Pub. Date: Apr. 28, 2016

(65) Prior Publication Data
US 2016/0254292 A1    Sep. 1, 2016

(30) Foreign Application Priority Data
Oct. 22, 2014    (CN) .......................... 2014 1 0567591

(51) Int. Cl.
*H01L 27/12* (2006.01)
*G02F 1/1333* (2006.01)
(Continued)

(52) U.S. Cl.
CPC ........ *H01L 27/1259* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS 7,704,766 B2    4/2010    Lee
8,501,512 B2    8/2013    Kim et al.
(Continued)

FOREIGN PATENT DOCUMENTS

CN    1429055 A    7/2003
CN    1538227 A    10/2004
(Continued)

OTHER PUBLICATIONS

Office Action dated Aug. 23, 2016 issued in corresponding Chinese Application No. 201410567591.0.
(Continued)

*Primary Examiner* — Angel Roman
(74) *Attorney, Agent, or Firm* — Nath, Goldberg & Meyer; Joshua B. Goldberg; Annie J. Kock

(57) ABSTRACT

The present invention provides a manufacturing method of an array substrate, an array substrate and a display apparatus. The manufacturing method comprises steps of: forming a thin film transistor and a signal line on a glass substrate, and forming an organic insulating layer above the thin film transistor and the signal line correspondingly; forming a passivation insulating layer on the organic insulating layer, wherein, before forming the passivation insulating layer, the manufacturing method further comprises a step of: performing a pre-heating process on the glass substrate on which the organic insulating layer is formed.

17 Claims, 1 Drawing Sheet

(51) Int. Cl.
    *G02F 1/1362* (2006.01)
    *G02F 1/1343* (2006.01)
    *H01L 21/02* (2006.01)
    *G02F 1/1368* (2006.01)
    *H01L 29/786* (2006.01)

(52) U.S. Cl.
    CPC .. *G02F 1/136286* (2013.01); *H01L 21/02271* (2013.01); *H01L 27/124* (2013.01); *H01L 27/1222* (2013.01); *H01L 27/1225* (2013.01); *H01L 27/1248* (2013.01); *G02F 1/133345* (2013.01); *G02F 2001/136295* (2013.01); *H01L 29/7869* (2013.01); *H01L 29/78666* (2013.01); *H01L 29/78669* (2013.01); *H01L 29/78675* (2013.01); *H01L 29/78678* (2013.01)

(56) References Cited

U.S. PATENT DOCUMENTS

| | | | |
|---|---|---|---|
| 2002/0149053 A1* | 10/2002 | Tsunoda | H01L 27/1214 257/347 |
| 2003/0038288 A1 | 2/2003 | Suzuki et al. | |
| 2004/0207784 A1* | 10/2004 | Lim | G02F 1/133555 349/114 |
| 2006/0145255 A1* | 7/2006 | Jeong | G02F 1/136286 257/347 |
| 2009/0191653 A1* | 7/2009 | Lee | G02F 1/133555 438/29 |
| 2015/0286082 A1* | 10/2015 | Nishiki | G02F 1/1368 349/43 |

FOREIGN PATENT DOCUMENTS

| | | |
|---|---|---|
| CN | 1932622 A | 3/2007 |
| CN | 102236230 A | 11/2011 |
| CN | 102709189 A | 10/2012 |
| CN | 103000694 A | 3/2013 |
| CN | 103123429 A | 5/2013 |
| CN | 103137628 A | 6/2013 |
| CN | 104319261 A | 1/2015 |
| JP | 2004072049 A | 3/2004 |

OTHER PUBLICATIONS

ISR issued in International application No. PCT/CN2015/074684 dated May 28, 2015.

Office Action dated Apr. 10, 2017 issued in corresponding Chinese Application No. 201410567591.0.

* cited by examiner

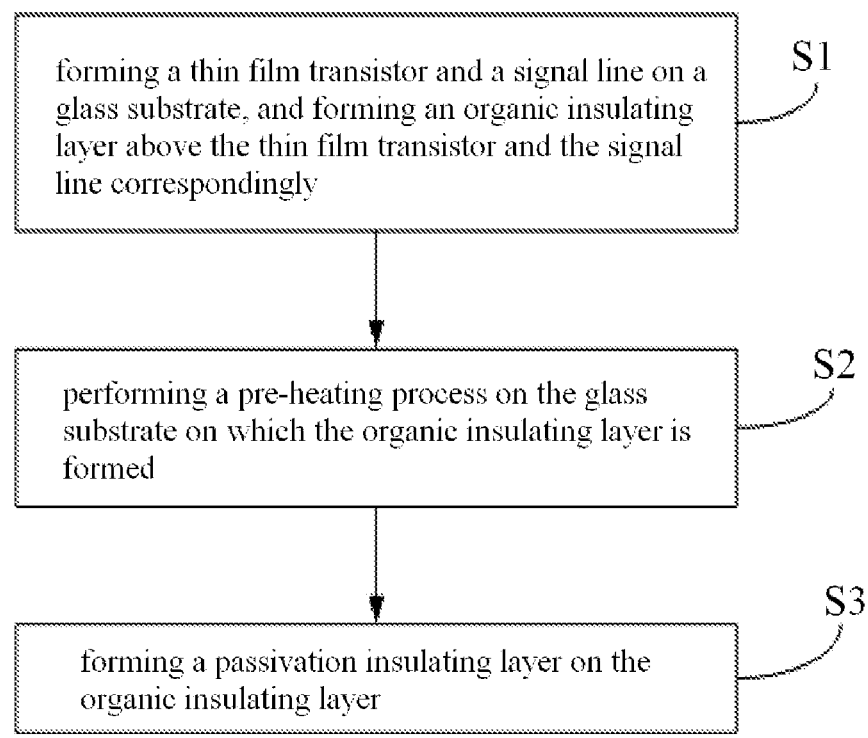

MANUFACTURING METHOD OF ARRAY SUBSTRATE, ARRAY SUBSTRATE AND DISPLAY APPARATUS

This is a National Phase Application filed under 35 U.S.C. 371 as a national stage of PCT/CN2015/074684, filed Mar. 20, 2015, an application claiming the benefit of Chinese Application No. 201410567591.0, filed Oct. 22, 2014, the content of each of which is hereby incorporated by reference in its entirety.

FIELD OF THE INVENTION

The present invention relates to the field of display technology, and particularly relates to a manufacturing method of an array substrate, an array substrate and a display apparatus.

BACKGROUND OF THE INVENTION

Thin film transistor liquid crystal display (TFT-LCD) has a dominant position in the current flat-panel display market because of its small size, low power consumption, no radiation and so on. An array substrate and a color filter substrate are aligned and combined to form a TFT-LCD panel. Gate lines and data lines intersecting with each other are provided in the array substrate to define pixel regions. Each pixel region is provided with a pixel electrode and a thin film transistor therein. A gate driving signal is applied to the gate lines, and image data signals are led to the pixel electrodes through the thin film transistors from the data lines. A black matrix is provided on the color filter substrate so that light cannot pass through the region other than the pixel electrodes. A color filter layer is provided in each pixel region, and on this basis, a common electrode is further provided. Liquid crystal is filled in the gap between the array substrate and the color filter substrate which are aligned and combined to form a cell. An electric field is formed between the common electrode and the pixel electrode to control deflection of the liquid crystal so as to control the intensity of the light passing through, and color filter function and so on is implemented by the color filter substrate, so that an image to be expressed is displayed on the display panel.

With increasing of people's demand for visual perception, liquid crystal displays with high resolution and low power consumption are more and more popular. Currently, the liquid crystal display generally utilizes amorphous silicon thin film transistors, that is, the active layer of the thin film transistor is made of amorphous silicon material. Due to influence of the migration rate of the amorphous silicon thin film transistor, the width-to-length ratio of the active layer of the thin film transistor is generally designed to be relatively large. Such design makes against to improve the resolution of the liquid crystal display, and reduces the opening rate of the liquid crystal display. Meanwhile, the power consumption of the liquid crystal display correspondingly increases quite a lot, resulting in that the liquid crystal display may not be driven normally by data driving chip.

In order to reduce the power consumption of the liquid crystal display panel, an organic insulating layer made of organic insulating film material is utilized. The organic insulating layer is generally provided between the pixel electrodes and the gate lines, the data lines. The utilization of the organic insulating layer increases the distance between the pixel electrodes and the gate lines, the data lines, so that parasitic capacitances between the pixel electrode and the gate lines, the data lines are correspondingly reduced, thus the power consumption of the liquid crystal display panel is decreased. With decreasing of the power consumption of the liquid crystal display panel, the number of the pixel electrodes can be increased correspondingly, thus the resolution of the amorphous silicon thin film transistor liquid crystal display is improved.

However, in the case of utilizing the organic insulating layer, before depositing a passivation insulating layer above the organic insulating layer, in a traditional method, a $N_2$ plasma process and a $N_2$ flow process are performed on a glass substrate on which the organic insulating layer is formed, these processes cause attenuating of interface state characteristics of the glass substrate on which the organic insulating layer is formed, so that the adhesion strength between the passivation insulating layer formed on the glass substrate and the glass substrate is weakened. In addition, the adhesion strength between the passivation insulating layer and the glass substrate is also lowered because the passivation insulating layer is deposited on the glass substrate on which the organic insulating layer is formed. Because of the above reasons, the passivation insulating layer is easy to fall off from the glass substrate on which the organic insulating layer is formed, resulting in a bad display quality of the liquid crystal display.

SUMMARY OF THE INVENTION

In view of the above problems existing in the prior art, the present invention provides a manufacturing method of an array substrate, an array substrate, and a display apparatus comprising the array substrate. The manufacturing method of the array substrate can enhance the interface state characteristics of the glass substrate on which the organic insulating layer is formed, thus enhance the adhesion strength between the passivation insulating layer and the glass substrate on which the organic insulating layer is formed, thereby the passivation insulating layer formed on the organic insulating layer may be prevented from falling off.

The present invention provides a manufacturing method of an array substrate, comprising steps of: forming a thin film transistor and a signal line on a glass substrate, and forming an organic insulating layer above the thin film transistor and the signal line correspondingly; forming a passivation insulating layer on the organic insulating layer, wherein, before forming the passivation insulating layer, the manufacturing method further comprises a step of: performing a pre-heating process on the glass substrate on which the organic insulating layer is formed.

Preferably, the passivation insulating layer includes a first passivation layer, and the signal line includes gate lines and data lines, wherein the step of forming the thin film transistor and the signal line on the glass substrate and forming the organic insulating layer above the thin film transistor and the signal line correspondingly comprises: step S10, forming the thin film transistor, the gate lines, the data lines and the organic insulating layer on the glass substrate, the organic insulating layer is formed above the thin film transistor, the gate lines and the data lines; the step of performing the pre-heating process on the glass substrate on which the organic insulating layer is formed comprises: step S11, performing pre-heating process on the glass substrate subjected to the step S10; and the step of forming the passivation insulating layer on the organic insulating layer comprises: step S12, forming the first passivation layer on the glass substrate subjected to the step S11.

Preferably, the manufacturing method further comprises: step S13, forming a first transparent electrode on the glass substrate subjected to the step S12.

Preferably, the passivation insulating layer further includes a second passivation layer, the manufacturing method further comprises: step S14, performing pre-heating process on the glass substrate subjected to the step S13; step S15, forming the second passivation layer on the glass substrate subjected to the step S14.

Preferably, the manufacturing method further comprises: step S16, forming a second transparent electrode on the glass substrate subjected to step S15.

Alternatively, the passivation insulating layer includes a second passivation layer, and the signal line includes gate lines and data lines, wherein the step of forming the thin film transistor and the signal line on the glass substrate and forming the organic insulating layer above the thin film transistor and the signal line correspondingly comprises: step S10', forming the thin film transistor, the gate lines, the data lines, the organic insulating layer, a first passivation layer and a first transparent electrode on the glass substrate, the first passivation layer is formed above the thin film transistor, the gate lines and the data lines, the organic insulating layer is formed on the first passivation layer, the first transparent electrode is formed above the organic insulating layer; the step of performing pre-heating process on the glass substrate on which the organic insulating layer is formed comprises: step S11', performing pre-heating process on the glass substrate subjected to the step S10'; and the step of forming the passivation insulating layer on the organic insulating layer comprises: step S12', forming the second passivation layer on the glass substrate subjected to the step S11'.

Preferably, the manufacturing method further comprises: step S13', forming a second transparent electrode on the glass substrate subjected to the step S12'.

Preferably, the first transparent electrode is a pixel electrode and the second transparent electrode is a common electrode, or, the first transparent electrode is a common electrode and the second transparent electrode is a pixel electrode.

Preferably, the second passivation layer includes a buffer layer, a bottom passivation layer and a top passivation layer, and the step of forming the second passivation layer comprises: step S101, depositing a buffer layer film for forming the buffer layer on the glass substrate subjected to the pre-heating process; step S102, depositing a bottom passivation layer film for forming the bottom passivation layer on the glass substrate subjected to the step S101; step S103, depositing a top passivation layer film for forming the top passivation layer on the glass substrate subjected to the step S102; and step 104, forming a pattern of the second passivation layer by performing exposure, development and etching process once.

Preferably, all of the buffer layer film, the bottom passivation layer film and the top passivation layer film are deposited by chemical vapor deposition method.

Preferably, in the step S101, a deposition power for depositing the buffer layer film ranges from 6 kW to 20 kW, a deposition thickness ranges from 20 mm to 30 mm, a deposition pressure ranges from 600 mTorr to 1000 mTorr, a deposition gas is a mixed gas of $SiH_4$, $NH_3$ and $N_2$, gas flow ratio among $SiH_4$, $NH_3$ and $N_2$ ranges from 1:2.3:15.6 to 1:16:45, and a deposition temperature ranges from 230° C. to 300° C.; in the step S102, the deposition power for depositing the bottom passivation layer film ranges from 6 kW to 18 kW, the deposition thickness ranges from 20 mm to 26 mm, the deposition pressure ranges from 1000 mTorr to 1500 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.; and in the step S103, the deposition power for depositing the top passivation layer film ranges from 6 kW to 15 kW, the deposition thickness ranges from 20 mm to 26 mm, the deposition pressure ranges from 1500 mTorr to 2000 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.

Preferably, a temperature for the pre-heating process ranges from 230° C. to 300° C., and a duration of the pre-heating process ranges from 15 seconds to 25 seconds.

Preferably, the thin film transistor comprises an active layer, and the active layer is made of amorphous silicon material, low temperature polycrystalline silicon material or transparent metal oxide material.

Preferably, the thin film transistor is of a top gate type or a bottom gate type.

The present invention also provides an array substrate which is manufactured by the above manufacturing method.

The present invention also provides a display apparatus comprising the above array substrate.

In the manufacturing method of the array substrate in the present invention, before forming the passivation insulating layer on the organic insulating layer, the pre-heating process is performed on the glass substrate on which the organic insulating layer is formed, compared with the prior art, nitrogen plasma process and nitrogen flow process on the glass substrate on which the organic insulating layer is formed are removed, so that the interface state characteristics of the glass substrate on which the organic insulating layer is formed are enhanced, thus the adhesion strength between the passivation insulating layer and the glass substrate on which the organic insulating layer is formed is enhanced, thereby the passivation insulating layer formed on the organic insulating layer may be prevented from falling off, and the quality of the array substrate is ensured.

The array substrate of the present invention is manufactured by the above manufacturing method, so that the passivation insulating layer formed on the organic insulating layer is not easy to fall off, and the quality of the array substrate is ensured.

The display apparatus of the present invention utilizes the array substrate, thus the quality of the display apparatus is ensured.

BRIEF DESCRIPTION OF THE DRAWINGS

FIG. 1 is a diagram of steps of a manufacturing method of an array substrate in the present invention.

DETAILED DESCRIPTION OF THE EMBODIMENTS

In order that those skilled in the art can better understand the technical solutions of the present invention, a further detailed description of a manufacturing method of an array substrate, an array substrate and a display apparatus in the present invention will be given below in conjunction with the accompanying drawings and specific implementations.

The present invention provides a manufacturing method of an array substrate, as shown in FIG. 1, comprising: step S1, forming a thin film transistor and a signal line on a glass substrate, and forming an organic insulating layer above the thin film transistor and the signal line correspondingly; step S3, forming a passivation insulating layer on the organic insulating layer, wherein, before forming the passivation insulating layer, the manufacturing method further comprises: step S2, performing a pre-heating process on the glass substrate on which the organic insulating layer is formed.

The pre-heating process enhances the interface state characteristics of the glass substrate on which the organic insulating layer is formed, thus the adhesion strength between the passivation insulating layer and the glass substrate on which the organic insulating layer is formed is enhanced, thereby the passivation insulating layer formed on the organic insulating layer is prevented from falling off, and the quality of the array substrate is ensured.

First Embodiment

In the present embodiment, the passivation insulating layer includes a first passivation layer, and the signal line includes gate lines and data lines. In the present embodiment, specifically, the step S1 comprises: step S10, forming the thin film transistor, the gate lines, the data lines and the organic insulating layer on the glass substrate, the organic insulating layer is formed above the thin film transistor, the gate lines and the data lines; the step S2 comprises: step S11, performing pre-heating process on the glass substrate subjected to the step S10; and the step S3 comprises: step S12, forming the first passivation layer on the glass substrate subjected to the step S11.

In the present embodiment, the gate lines and the gate of the thin film transistor are formed by using the same material at the same time, and the data lines and the source and drain of the thin film transistor are formed by using the same material at the same time, that is, the gate lines and the gate are formed in the same layer, the data lines and the source, the drain are formed in the same layer.

In the present embodiment, the formation of the organic insulating layer includes: applying a layer of organic insulating material on the glass substrate on which the thin film transistor, the gate lines and the data lines are formed, then forming a pattern of the organic insulating layer by an exposure, development and etching process.

In the step S11, the temperature for the pre-heating process ranges from 230° C. to 300° C., and the duration of the pre-heating process ranges from 15 seconds to 25 seconds. Such process can ensure to enhance the interface state characteristics of the glass substrate subjected to the step S10.

In the present embodiment, the adhesion strength between the first passivation layer and the glass substrate subjected to the step S11 is enhanced, thus the first passivation layer and the glass substrate subjected to the step S11 are adhered with each other firmly, so that the first passivation layer is not easy to fall off from the glass substrate subjected to the step S11.

In the present embodiment, the manufacturing method further comprises: step S13, forming a first transparent electrode on the glass substrate subjected to the step S12.

In the present embodiment, the passivation insulating layer further includes a second passivation layer, and the manufacturing method further comprises: step S14, performing pre-heating process on the glass substrate subjected to the step S13; step S15, forming the second passivation layer on the glass substrate subjected to the step S14.

In the step S14, the temperature for the pre-heating process ranges from 230° C. to 300° C., and the duration of the pre-heating process ranges from 15 seconds to 25 seconds. Such process can ensure to enhance the interface state characteristics of the glass substrate subjected to the step S13.

In the present embodiment, the second passivation layer includes a buffer layer, a bottom passivation layer and a top passivation layer, and the step of forming the second passivation layer comprises: step S101, depositing a buffer layer film for forming the buffer layer on the glass substrate subjected to the pre-heating process; step S102, depositing a bottom passivation layer film for forming the bottom passivation layer on the glass substrate subjected to the step S101; step S103, depositing a top passivation layer film for forming the top passivation layer on the glass substrate subjected to the step S102; and step 104, forming a pattern of the second passivation layer by performing exposure, development and etching process once.

In the step S101, the buffer layer film is deposited by chemical vapor deposition method, a deposition power for depositing the buffer layer film ranges from 6 kW to 20 kW, a deposition thickness ranges from 20 mm to 30 mm, a deposition pressure ranges from 600 mTorr to 1000 mTorr, a deposition gas is a mixed gas of $SiH_4$, $NH_3$ and $N_2$, gas flow ratio among $SiH_4$, $NH_3$ and $N_2$ ranges from 1:2.3:15.6 to 1:16:45, and a deposition temperature ranges from 230° C. to 300° C.

In the step S102, the bottom passivation layer film is deposited by chemical vapor deposition method, the deposition power for depositing the bottom passivation layer film ranges from 6 kW to 18 kW, the deposition thickness ranges from 20 mm to 26 mm, the deposition pressure ranges from 1000 mTorr to 1500 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.

In the step S103, the top passivation layer film is deposited by chemical vapor deposition method, the deposition power for depositing the top passivation layer film ranges from 6 kW to 15 kW, the deposition thickness ranges from 20 mm to 26 mm, the deposition pressure ranges from 1500 mTorr to 2000 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.

In the present embodiment, the second passivation layer consists of the buffer layer, the bottom passivation layer and the top passivation layer, wherein the buffer layer can prevent the formation of black spots due to chemical reaction between the second passivation layer and the components in the first transparent electrode during the formation of the second passivation layer. The densities of the bottom passivation layer and the top passivation layer in the second passivation layer are different from each other, so that a good slope is formed while performing a dry etching, thus when a subsequent film is conductive with the film below the second passivation layer through via holes formed in the second passivation layer, no crack will occur, thus a poor lap joint is avoided.

In the present embodiment, the adhesion strength between the second passivation layer and the glass substrate subjected to the step S14 is enhanced, thus the second passivation layer and the glass substrate subjected to the step S14 are adhered with each other firmly, so that the second passivation layer is not easy to fall off from the glass substrate subjected to the step S14.

In the present embodiment, the manufacturing method further comprises: step S16, forming a second transparent electrode on the glass substrate subjected to step S15.

In the present embodiment, the first transparent electrode is a pixel electrode and the second transparent electrode is a common electrode. Of course, the first transparent electrode may be a common electrode and the second transparent electrode is a pixel electrode. That is, the array substrate of the present embodiment is an array substrate of ADS mode. In the present embodiment, parasitic capacitances between the pixel electrode and the gate lines, the data lines, the gate, the source are reduced by the organic insulating layer, meanwhile, parasitic capacitances between the common electrode and the gate lines, the data lines, the gate, the source are reduced, thus the power consumption of the array substrate is reduced.

In the present embodiment, the thin film transistor comprises an active layer, and the active layer is made of amorphous silicon material. It should be noted that, the active layer may also be made of low temperature polycrystalline silicon material or transparent metal oxide material.

In addition, in the present embodiment, the thin film transistor is of a top gate type. Of course, the thin film transistor may also be of a bottom gate type.

Second Embodiment

The present embodiment provides a manufacturing method of an array substrate which is different from that in the first embodiment in that, the passivation insulating layer does not comprise the second passivation layer, correspondingly, the manufacturing method of the array substrate does not comprise the steps S14 through S16.

Correspondingly, the first transparent electrode in the present embodiment is a pixel electrode. That is, the array substrate of the present embodiment is an array substrate of TN mode.

Other steps of the manufacturing method of the array substrate in the present embodiment are the same as those in the first embodiment, and are not repeatedly described here.

Third Embodiment

The present embodiment provides a manufacturing method of an array substrate which is different from those in the first and second embodiments in that, the passivation insulating layer comprises the second passivation layer, and the signal line includes gate lines and data lines. In the present embodiment, specifically, the step S1 comprises: step S10', forming the thin film transistor, the gate lines, the data lines, the organic insulating layer, a first passivation layer and a first transparent electrode on the glass substrate, the first passivation layer is formed above the thin film transistor, the gate lines and the data lines, the organic insulating layer is formed on the first passivation layer, the first transparent electrode is formed above the organic insulating layer; the step S2 comprises: step S11', performing pre-heating process on the glass substrate subjected to the step S10'; and the step S3 comprises: step S12', forming the second passivation layer on the glass substrate subjected to the step S11'.

In the step S11', the temperature for the pre-heating process ranges from 230° C. to 300° C., and the duration of the pre-heating process ranges from 15 seconds to 25 seconds. Such process can ensure to enhance the interface state characteristics of the glass substrate subjected to the step S10'.

In the present embodiment, the constitution, manufacturing method and manufacturing procedure of the second passivation layer are the same as those in the first embodiment, and are not repeatedly described here.

In the present embodiment, the manufacturing method further comprises: step S13', forming a second transparent electrode on the glass substrate subjected to the step S12'.

The array substrate of the present embodiment is an array substrate of ADS (Advanced Super Dimension Switch) mode.

Other structures and materials of the array substrate of the present embodiment are the same as those in the first embodiment, and are not repeatedly described here.

In the manufacturing methods of the array substrate in the first through third embodiments, before forming the passivation insulating layer on the organic insulating layer, the pre-heating process is performed on the glass substrate on which the organic insulating layer is formed, compared with the prior art, nitrogen plasma process and nitrogen flow process on the glass substrate on which the organic insulating layer is formed are removed, so that the interface state characteristics of the glass substrate on which the organic insulating layer is formed are enhanced, thus the adhesion strength between the passivation insulating layer and the glass substrate on which the organic insulating layer is formed is enhanced, thereby the passivation insulating layer formed on the organic insulating layer may be prevented from falling off, and the quality of the array substrate is ensured.

Fourth Embodiment

The present embodiment provides an array substrate which is manufactured by the manufacturing method in any one of the first through third embodiments.

The array substrate is an array substrate of TN (Twisted Nematic) mode or an array substrate of ADS mode.

In the array substrate manufactured by the manufacturing method in any one of the first through third embodiments, the passivation insulating layer formed on the organic insulating layer is not easy to fall off, and the quality of the array substrate is ensured.

Fifth Embodiment

The present embodiment provides a display apparatus comprising the array substrate of the fourth embodiment.

The display apparatus of the present embodiment utilizes the array substrate of the fourth embodiment, thus the quality of the display apparatus is ensured.

It can be understood that, the foregoing implementations are merely exemplary implementations used for explaining the principle of the present invention, but the present invention is not limited thereto. Those of ordinary skill in the art may make various variations and improvements without departing from the spirit and essence of the present invention, and these variations and improvements also fall within the protection scope of the present invention.

The invention claimed is:

1. A manufacturing method of an array substrate, comprising steps of: forming a thin film transistor and a signal line on a glass substrate, and forming an organic insulating layer above the thin film transistor and the signal line correspondingly; forming a passivation insulating layer on the organic insulating layer, wherein, before forming the passivation insulating layer, the manufacturing method further comprises a step of: performing a pre-heating process on the glass substrate on which the organic insulating layer is formed, wherein a temperature for the pre-heating process ranges from 230° C. to 300° C., and a duration of the pre-heating process ranges from 15 seconds to 25 seconds.

2. The manufacturing method of claim 1, wherein the passivation insulating layer includes a first passivation layer, and the signal line includes gate lines and data lines, wherein, the step of forming the thin film transistor and the signal line on the glass substrate and forming the organic insulating layer above the thin film transistor and the signal line correspondingly comprises: step S10, forming the thin film transistor, the gate lines, the data lines and the organic insulating layer on the glass substrate, the organic insulating layer is formed above the thin film transistor, the gate lines and the data lines;

the step of performing the pre-heating process on the glass substrate on which the organic insulating layer is formed comprises: step S11, performing the pre-heating process on the glass substrate subjected to the step S10; and the step of forming the passivation insulating layer on the organic insulating layer comprises: step S12, forming the first passivation layer on the glass substrate subjected to the step S11.

3. The manufacturing method of claim 2, further comprises:

step S13, forming a first transparent electrode on the glass substrate subjected to the step S12.

4. The manufacturing method of claim 3, wherein the passivation insulating layer further includes a second passivation layer, the manufacturing method further comprises:

step S14, performing pre-heating process on the glass substrate subjected to the step S13;

step S15, forming the second passivation layer on the glass substrate subjected to the step S14.

5. The manufacturing method of claim 4, wherein the second passivation layer includes a buffer layer, a bottom passivation layer and a top passivation layer, and the step of forming the second passivation layer comprises:

step S101, depositing a buffer layer film for forming the buffer layer on the glass substrate subjected to the pre-heating process;

step S102, depositing a bottom passivation layer film for forming the bottom passivation layer on the glass substrate subjected to the step S101;

step S103, depositing a top passivation layer film for forming the top passivation layer on the glass substrate subjected to the step S102; and step 104, forming a pattern of the second passivation layer by performing exposure, development and etching process once.

6. The manufacturing method of claim 5, wherein all of the buffer layer film, the bottom passivation layer film and the top passivation layer film are deposited by chemical vapor deposition method.

7. The manufacturing method of claim 6, wherein, in the step S101, a deposition power for depositing the buffer layer film ranges from 6 kW to 20 kW, a deposition thickness ranges from 20 mm to 30 mm, a deposition pressure ranges from 600 mTorr to 1000 mTorr, a deposition gas is a mixed gas of $SiH_4$, $NH_3$ and $N_2$, gas flow ratio among $SiH_4$, $NH_3$ and $N_2$ ranges from 1:2.3:15.6 to 1:16:45, and a deposition temperature ranges from 230° C. to 300° C.;

in the step S102, the deposition power for depositing the bottom passivation layer film ranges from 6 kW to 18 kW, the deposition thickness ranges from 20 mm to 26 mm, the deposition pressure ranges from 1000 mTorr to 1500 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.; and in the step S103, the deposition power for depositing the top passivation layer film ranges from 6 kW to 15 kW, the deposition thickness ranges from 20 mm to 26 mm, the deposition pressure ranges from 1500 mTorr to 2000 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.

8. The manufacturing method of claim 4, further comprises:

step S16, forming a second transparent electrode on the glass substrate subjected to step S15.

9. The manufacturing method of claim 8, wherein the first transparent electrode is a pixel electrode and the second transparent electrode is a common electrode, or, the first transparent electrode is a common electrode and the second transparent electrode is a pixel electrode.

10. The manufacturing method of claim 1, wherein the passivation insulating layer includes a second passivation layer, and the signal line includes gate lines and data lines, wherein, the step of forming the thin film transistor and the signal line on the glass substrate and forming the organic insulating layer above the thin film transistor and the signal line correspondingly comprises: step S10', forming the thin film transistor, the gate lines, the data lines, the organic insulating layer, a first passivation layer and a first transparent electrode on the glass substrate, the first passivation layer is formed above the thin film transistor, the gate lines and the data lines, the organic insulating layer is formed on the first passivation layer, the first transparent electrode is formed above the organic insulating layer;

the step of performing pre-heating process on the glass substrate on which the organic insulating layer is formed comprises: step S11', performing pre-heating process on the glass substrate subjected to the step S10'; and the step of forming the passivation insulating layer on the organic insulating layer comprises: step S12', forming the second passivation layer on the glass substrate subjected to the step S11'.

11. The manufacturing method of claim 10, wherein the second passivation layer includes a buffer layer, a bottom passivation layer and a top passivation layer, and the step of forming the second passivation layer comprises:

step S101, depositing a buffer layer film for forming the buffer layer on the glass substrate subjected to the pre-heating process;

step S102, depositing a bottom passivation layer film for forming the bottom passivation layer on the glass substrate subjected to the step S101;

step S103, depositing a top passivation layer film for forming the top passivation layer on the glass substrate subjected to the step S102; and step S104, forming a pattern of the second passivation layer by performing exposure, development and etching process once.

12. The manufacturing method of claim 11, wherein all of the buffer layer film, the bottom passivation layer film and the top passivation layer film are deposited by chemical vapor deposition method.

13. The manufacturing method of claim 12, wherein,
in the step S101, a deposition power for depositing the buffer layer film ranges from 6 kW to 20 kW, a deposition thickness ranges from 20 mm to 30 mm, a deposition pressure ranges from 600 mTorr to 1000 mTorr, a deposition gas is a mixed gas of $SiH_4$, $NH_3$ and $N_2$, gas flow ratio among $SiH_4$, $NH_3$ and $N_2$ ranges from 1:2.3:15.6 to 1:16:45, and a deposition temperature ranges from 230° C. to 300° C.;
in the step S102, the deposition power for depositing the bottom passivation layer film ranges from 6 kW to 18 kW, the deposition thickness ranges from 20 mm to 26 mm, the deposition pressure ranges from 1000 mTorr to 1500 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.; and
in the step S103, the deposition power for depositing the top passivation layer film ranges from 6 kW to 15 kW, the deposition thickness ranges from 20 mm to 26 mm, the deposition pressure ranges from 1500 mTorr to 2000 mTorr, the deposition gas is a mixed gas of $SiH_4$, $NH_3$ and $N_2$, gas flow ratio among $SiH_4$, $NH_3$ and $N_2$ ranges from 1:2.5:7.5 to 1:3.2:9.0, and the deposition temperature ranges from 230° C. to 300° C.

14. The manufacturing method of claim 10, further comprises:
step S13', forming a second transparent electrode on the glass substrate subjected to the step S12'.

15. The manufacturing method of claim 14, wherein the first transparent electrode is a pixel electrode and the second transparent electrode is a common electrode, or, the first transparent electrode is a common electrode and the second transparent electrode is a pixel electrode.

16. The manufacturing method of claim 1, wherein the thin film transistor comprises an active layer, and the active layer is made of amorphous silicon material, low temperature polycrystalline silicon material or transparent metal oxide material.

17. The manufacturing method of claim 1, wherein the thin film transistor is of a top gate type or a bottom gate type.

* * * * *